US007049034B2

(12) United States Patent
Martin et al.

(10) Patent No.: US 7,049,034 B2
(45) Date of Patent: May 23, 2006

(54) PHOTOMASK HAVING AN INTERNAL SUBSTANTIALLY TRANSPARENT ETCH STOP LAYER

(75) Inventors: Patrick M. Martin, Dallas, TX (US); Matthew Lassiter, Allen, TX (US); Darren Taylor, Allen, TX (US); Michael Cangemi, McKinney, TX (US); Eric Poortinga, Allen, TX (US)

(73) Assignee: Photronics, Inc., Brookfield, CT (US)

( * ) Notice: Subject to any disclaimer, the term of this patent is extended or adjusted under 35 U.S.C. 154(b) by 266 days.

(21) Appl. No.: 10/658,039

(22) Filed: Sep. 9, 2003

(65) Prior Publication Data

US 2005/0053847 A1   Mar. 10, 2005

(51) Int. Cl.
*G01F 9/00* (2006.01)
(52) U.S. Cl. .......................................... 430/5
(58) Field of Classification Search ................... 430/5, 430/313, 323
See application file for complete search history.

(56) References Cited

U.S. PATENT DOCUMENTS

| 4,178,403 A | 12/1979 | Sakurai et al. |
| 4,556,608 A | 12/1985 | Kaneki et al. |
| 4,720,442 A | 1/1988 | Shinkai et al. |
| 5,439,763 A | 8/1995 | Shimase et al. |
| 5,451,543 A | 9/1995 | Woo et al. |
| 5,460,908 A | 10/1995 | Reinberg |
| 5,472,811 A | 12/1995 | Vasudev et al. |
| 5,477,058 A | 12/1995 | Sato |
| 5,482,799 A | 1/1996 | Isao et al. |

(Continued)

FOREIGN PATENT DOCUMENTS

JP   2-39153   2/1990

(Continued)

OTHER PUBLICATIONS

Matthew Lassiter, et al., "157nm Binary and Embedded Attenuated PSM Films", 157 nm Symposium, Yokohama (2003).

(Continued)

*Primary Examiner*—S. Rosasco
(74) *Attorney, Agent, or Firm*—Amster, Rothstein & Ebenstein, LLP (57) ABSTRACT

The present invention generally relates, to optical lithography and more particularly relates to the fabrication of transparent or semitransparent phase shifting masks used in the manufacture of semiconductor devices. In particular, the present invention utilizes an internal etch stop layer and either a deposited substantially transparent layer, deposited partially transparent layer or deposited opaque thereon in an otherwise conventional photomask. The photomask of the present invention is used to make semiconductor devices or integrated circuits. In a preferred embodiment of the present invention is directed to an aaPSM comprising: a patterned opaque layer with a first set of at least one light transmitting openings and a second set of at least one light transmitting openings; a deposited substantially transparent layer underlying the opaque layer wherein the deposited substantially transparent layer has corresponding light transmitting openings to each of the openings of the first set of at least one light transmitting openings, a substantially transparent etch stop layer underlying the deposited substantially transparent layer, and a substantially transparent substrate underlying the transparent etch stop layer. In a preferred embodiment, the internal substantially transparent etch stop layer of the present invention is comprised of $MgF_x$ and even more particularly may be comprised of $MgF_2$ deposited under evaporation. Other materials that may be used for the substantially transparent etch stop layer of the present invention include but are not limited to $Al_2O_3$ and $Al_xN_y$.

35 Claims, 9 Drawing Sheets

U.S. PATENT DOCUMENTS

| | | | |
|---|---|---|---|
| 5,547,787 A | 8/1996 | Ito et al. | |
| 5,578,402 A | 11/1996 | Watanabe | |
| 5,693,568 A | 12/1997 | Liu et al. | |
| 5,725,973 A | 3/1998 | Han et al. | |
| 5,756,396 A | 5/1998 | Lee et al. | |
| 5,876,877 A * | 3/1999 | Hanyu et al. | 430/5 |
| 5,935,733 A | 8/1999 | Scott et al. | |
| 5,935,740 A | 8/1999 | Pierrat | |
| 5,939,227 A | 8/1999 | Smith | |
| 5,955,222 A | 9/1999 | Hibbs et al. | |
| 5,981,110 A | 11/1999 | George et al. | |
| 6,120,942 A | 9/2000 | Reinberg | |
| 6,174,771 B1 | 1/2001 | Leu | |
| 6,187,480 B1 | 2/2001 | Huang | |
| 6,190,836 B1 | 2/2001 | Grenon et al. | |
| 6,221,542 B1 | 4/2001 | Reinberg | |
| 6,261,963 B1 | 7/2001 | Zhao et al. | |
| 6,335,130 B1 | 1/2002 | Chen et al. | |
| 6,355,557 B1 | 3/2002 | Stinnett et al. | |
| 6,368,967 B1 | 4/2002 | Besser | |
| 6,429,033 B1 | 8/2002 | Gee et al. | |
| 6,515,343 B1 | 2/2003 | Shroff et al. | |
| 6,544,696 B1 | 4/2003 | Westerman et al. | |
| 6,562,522 B1 | 5/2003 | Yan | |
| 6,582,856 B1 * | 6/2003 | Quek et al. | 430/5 |
| 6,610,594 B1 | 8/2003 | Apelgren et al. | |
| 6,699,625 B1 | 3/2004 | Lee et al. | |
| 6,703,252 B1 | 3/2004 | Chen et al. | |
| 6,730,445 B1 | 5/2004 | Angelopoulos et al. | |
| 6,743,553 B1 | 6/2004 | Shiota et al. | |
| 6,780,548 B1 | 8/2004 | Kalk | |
| 2001/0035547 A1 | 11/2001 | Isogai | |
| 2001/0044056 A1 | 11/2001 | Kokubo | |
| 2001/0051420 A1 | 12/2001 | Besser et al. | |
| 2002/0111030 A1 | 8/2002 | Batra et al. | |
| 2002/0123217 A1 | 9/2002 | Subramanian et al. | |
| 2002/0142585 A1 | 10/2002 | Mandal | |
| 2002/0160520 A1 | 10/2002 | Orloff et al. | |
| 2002/0173162 A1 | 11/2002 | Liu et al. | |
| 2002/0192944 A1 | 12/2002 | Sonderman et al. | |
| 2003/0118920 A1 | 6/2003 | Johnstone et al. | |
| 2003/0211728 A1 | 11/2003 | Mandal | |
| 2003/0228047 A1 | 12/2003 | Chou et al. | |
| 2003/0228529 A1 | 12/2003 | Dieu et al. | |
| 2004/0058139 A1 | 3/2004 | Dubin et al. | |
| 2004/0094760 A1 | 5/2004 | Taylor et al. | |
| 2004/0126057 A1 | 7/2004 | Yoo | |
| 2004/0137335 A1 | 7/2004 | Cummings | |

FOREIGN PATENT DOCUMENTS

| | | |
|---|---|---|
| JP | 7-104457 | 4/1995 |
| JP | 8-76353 | 3/1996 |
| JP | 2001-174973 | 6/2001 |

OTHER PUBLICATIONS

Matthew Lassiter, et al., "Improved Phase Uniformity Control Using a New AAPSM Etch Stop Layer Technique", SPIE vol. 5256, 23rd Annual BACUS Symposium on Photomask Technology (2003).

Michael Cangemi, et al., "Implementation of a Transparent Etch Stop Layer for an Improved Alternating PSM", VDE vol. 43, 20th European Conference on Mask Technology for Integrated Circuits and Microcomponents 2004.

Canon Presentation, "Canon's IDEAL: Innovative Double Exposure by Advanced Lithography," BACUS News, SPIE, Apr. 2001, vol. 17, Issue 4, p. 1-7.

T. Ebihara, T. Oga, P.D. Rhyins, M. Sweis, P.M. Martin, "150-nm dense/isolated contact hole study with Canon IDEAL technique", SPIE Proceeding 4562-119.

R.L. Kosetelak, C. Pierrat, J.G. Garofalo, and S. Vaidya, "Exposure characteristics of alternate aperture phase-shifting masks fabricated using a subtractive process", J. Vac. Sci. Tech. B0, 3055-3061 (1992).

M.D. Levenson, N.S. Viswanathan, and R.A. Simpson, "Improving Resolution with a Phase-Shifting Mask", IEEE Trans. Elect. Dev. ED-29, 1828-1836 (1982.)

K.D. Lucas, C.M. Yuan, and A.J. Stroljwas, "A rigorous and practical vector model for phase shigting masks in optical lithography", Proc. SPIE 1674, 252-263 (1992).

Armin Semmler, L. Mader, A. Elsner, R. Koehle, O. Griesinger, C. Noelscher "Application of 3D EMF Simulation for Development and Optimization of Alternating Phase Shifting Masks", Optical Microlithography XIV, Proceedings of SPIE, 2001, p. 356-367, vol. 4346 (Christopher J. Progler, ed.).

Song Peng, "Through-Focus Image Balancing of Alternating Phase Shifting Maskes", SPIE vol. 3873, p. 328-336 (1999).

T. Terasawa, N. Hasegawa, A. IMAI and S. Okazaki, "Analysis of Nonplanar Topography Effects of Phase Shift Masks on Imaging Characteristics", Japanese J. Appl. Phys. 34, 6578-6583 (1995).

T. Teresawa, N, Hasegawa, T. Tanaka, S. Katagiri, and T. Kurosaki, "Improved Resolution of an i-line stepper using a phase-shift mask", J. Vac. Sci. Tech. B8, 1300-1308, (1990).

* cited by examiner

PHOTOMASK HAVING AN INTERNAL SUBSTANTIALLY TRANSPARENT ETCH STOP LAYER

FIELD OF THE INVENTION

The present invention generally relates to optical lithography and more particularly relates to improved photomasks and methods of making the same, including alternating aperture phase shift masks ("aaPSMs"), and methods of making the same. More particularly, the present invention relates to improved aaPSMs having an internal substantially transparent etch stop layer and a layer deposited thereon.

BACKGROUND OF THE INVENTION

Photomasks are high precision plates containing microscopic images of electronic circuits. Photomasks are typically made from flat pieces of material that are substantially transparent, such as quartz or glass, with an opaque layer, such as chrome, on one side. Etched in the opaque layer (e.g., chrome) of the mask is a pattern corresponding to a portion of an electronic circuit design. A variety of different photomasks, including for example, aaPSMs, embedded attenuated phase shift masks and binary photomasks (e.g., chrome-on-glass), are used in semiconductor processing to transfer these patterns onto a semiconductor wafer or other type of wafer.

Figure 1A:
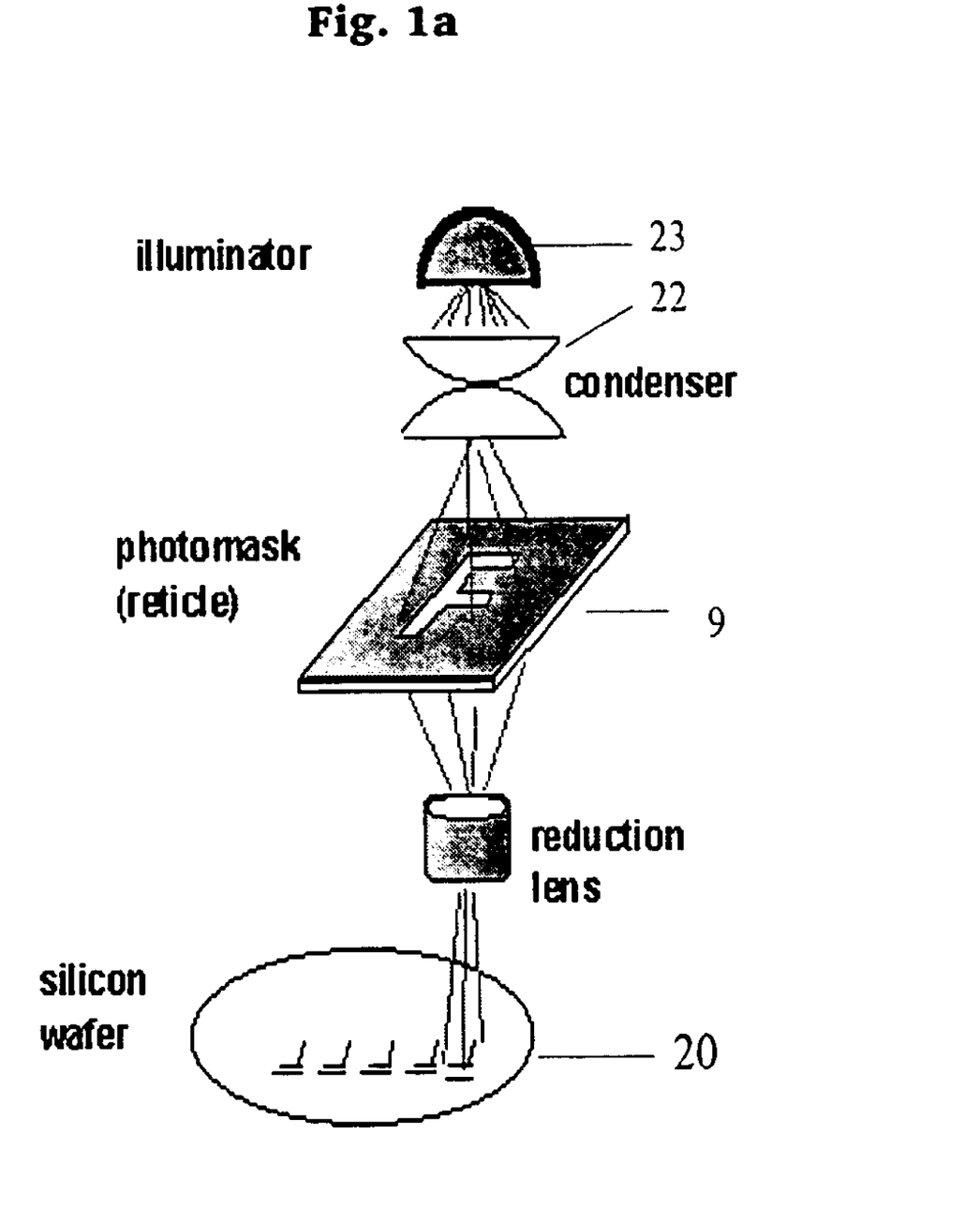
FIG. 1a shows the equipment which can be used to make a semiconductor device from the aaPSM of the present invention.
Figure 1B:
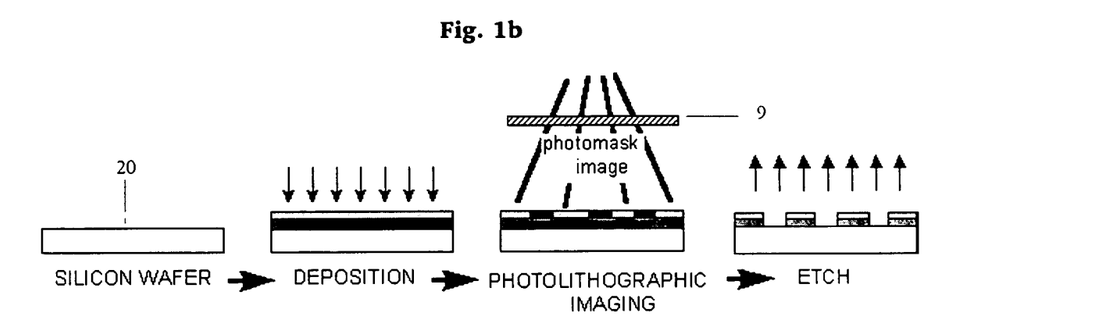
FIG. 1b is flow diagram showing an example of the process for making a semiconductor device.

As shown in FIGS. 1a and 1b, to create an image on a semiconductor wafer 20, a photomask 9 is interposed between the semiconductor wafer 20 (which includes a layer of photosensitive material) and an optical system 22. Energy generated by an energy source 23, commonly referred to as a Stepper, is inhibited from passing through opaque areas of the photomask 9. Likewise, energy from the Stepper passes through the substantially transparent portions of the photomask 9, thereby projecting a diffraction limited, latent image of the pattern on the photomask onto the semiconductor wafer 20. In this regard, the energy generated by the Stepper causes a reaction in the photosensitive material on the semiconductor wafer such that the solubility of the photosensitive material is changed in areas exposed to the energy. Thereafter, the soluble photosensitive material (either exposed or unexposed) is removed from the semiconductor wafer 20, depending upon the type of photolithographic process being used. For example, where a positive photolithographic process is implemented, the exposed photosensitive material becomes soluble and is removed. By contrast, where a negative photolithographic process is used, the exposed photosensitive material becomes insoluble and the unexposed, soluble photosensitive material is removed. After the appropriate photosensitive material is removed, a pattern corresponding to the photomask 9 appears on the semiconductor wafer 20. Thereafter, the semiconductor wafer 20 can be used for deposition, etching, and/or ion implantation processes in any combination to form an integrated circuit.

As circuit designs have become increasingly complex, semiconductor manufacturing processes have become more sophisticated to meet the requirements of these complexities. In this regard, devices on semiconductor wafers have continued to shrink while circuit densities have continued to increase. This has resulted in an increased use of devices packed with smaller feature sizes, narrower widths and decreased spacing between interconnecting lines. For photolithographic processes, resolution and depth of focus (DoF) are important parameters in obtaining high fidelity of pattern reproduction from a photomask to a wafer. However, as feature sizes continue to decrease, the devices' sensitivity to the varying exposure tool wavelengths (e.g., 248 nm, 193 nm, 157 nm, 13 nm, etc.) used to write images on a semiconductor wafer has increased, thereby making it more and more difficult to write to an accurate image on the semiconductor wafer. In this regard, as feature sizes continue to decrease, light diffraction effects in the photomask are exacerbated, thereby increasing the likelihood that defects will manifest in a pattern written on a semiconductor wafer. Accordingly, it has become necessary to develop new methods to minimize the problems associated with these smaller feature sizes.

One known method for increasing resolution in smaller feature sizes involves the use of shorter exposure wavelengths (e.g., 248 nm, 193 nm, 157 nm, 13 nm, etc.). Shorter exposure wavelengths, however, typically result in a shallower DoF in conventional binary chrome-on-glass (COG) photomasks having smaller feature sizes. In this regard, when the feature size is smaller than the exposure tool wavelength, binary COG photomasks become diffraction limited, thereby making it difficult, if not impossible, to write an accurate image on the semiconductor wafer. Accordingly, phase shifting masks ("PSMs") have been used to overcome this problem. In this regard, PSMs are known to have properties which permit high resolution while maintaining a sufficient DoF. More particularly, a PSM reduces the diffraction limitation ordinarily associated with a binary COG mask by passing light through substantially transparent areas (e.g., glass, quartz or fused silica) which have either different thickness and/or different refractive indices than an ordinary binary COG mask. As a result, destructive interference is created in regions on the target semiconductor wafer that are designed to see no exposure. Thus, by reducing the impact of diffraction through phase shifting, the overall printability of an image is vastly improved such that the minimum width of a pattern resolved by using a PSM is approximately half the width of a pattern resolved in using an ordinary binary COG mask.

Figure 2A:
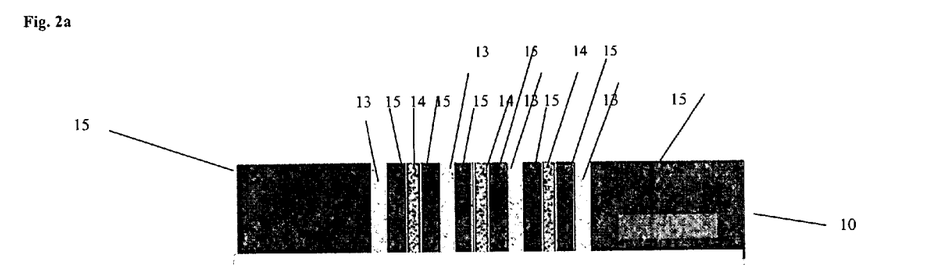
FIG. 2a shows a plan view of a conventional aaPSM.
Figure 2B:
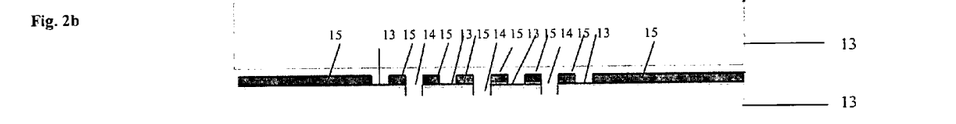
FIG. 2b shows a cross-sectional view of conventional aaPSM.
Figure 2C:
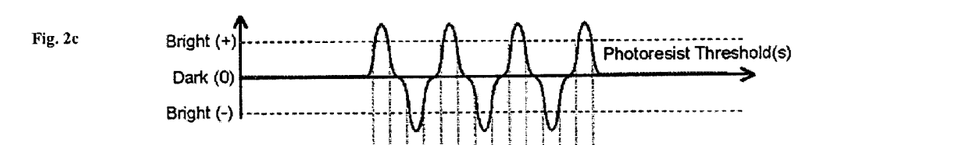
FIG. 2c shows the light intensity transmitted through the aaPSM of FIGS. 2a–b.
Figure 2D:
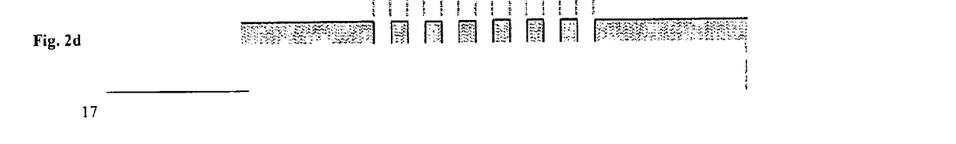
FIG. 2d is a semiconductor wafer exposed to light transmitted through the aaPSM of FIGS. 2a–b.

Various types of PSMs have been developed and are known in the art, including aaPSMs as described in copending U.S. patent application Ser. No. 10/288,736, filed Nov. 5, 2002 and U.S. patent application Ser. No. 10/391, 001 filed Mar. 18, 2003, which are incorporated by reference herein. FIGS. 2a–b illustrate an example of a conventional aaPSM 10. An aaPSM is typically comprised of a layer of opaque material and a substantially transparent substrate which is etched on one side of the opaque features, while not etched on the other side (e.g., etching of the transparent substrate occurs in alternating locations in the substantially transparent substrate). More particularly, as shown in FIGS. 2a–b, the aaPSM 10 includes a substantially transparent layer 13 (e.g., glass, quartz or fused silica) and an opaque layer (e.g., chrome). The opaque layer is etched to form opaque regions 15 and alternating substantially transparent regions 13, as shown in FIG. 2b. The substantially transparent regions 13 are further etched such that the aaPSM 10 has recesses 14 in the substantially transparent layer. In other words, the aaPSM 10 has substantially transparent regions 13 (which are un-etched) that alternate with etched recesses 14 between each opaque region 15, as shown in FIGS. 2a–b. The effect of this structure when placed in a Stepper is to create light intensity of alternating polarity and 180° out of phase, as shown in FIG. 2c. This alternating polarity forces energy transmitted from the Stepper to go to zero, in theory, at opaque regions 15 while maintaining the same transmission of light at the alternating transparent regions 13 and recesses 14. As a result, refraction is reduced through this region. In this regard, in recesses 14, equation (1) is satisfied:

$$d=\lambda/2(n-1) \quad (1)$$

where d is film thickness, n is refractive index at exposure wavelength, λ is exposure wavelength. Thus, it is possible to etch smaller features in a semiconductor wafer and use shorter exposure wavelengths. Since the photoresist layer on the semiconductor wafer (FIG. 2*d*) is insensitive to the phase of the exposed light, the positive and negative exposed regions appear the same, while the zero region in between is clearly delineated. Thus, a sharper contrast between light (e.g., transparent) and dark (e.g., opaque) regions in the resulting photoresist layer of a semiconductor is obtained, thereby making it possible, in theory, to etch a more accurate image onto the semiconductor wafer.

In practice, however, it is difficult to insure as the size of aaPSM continue to get smaller that the etched trenches are formed accurately. Conventional processes used to make aaPSMs etch the photomask to blank a specific depth which is determined by the wavelength of radiation used, as discussed above. Since this depth is significantly less than the photomask substrate thickness, there is no known technique where an optical emission spectrum (OES) could be used to determine the exact and appropriate etch time needed. In addition, there is no additional etching step (referred to as "overetch") that can be done to address the plasma non-uniformity. Thus, there has been a long felt need for end point detection methods using an OES technique which allows for additional overetch time to adjust for any non-uniformities associated with plasma loading effects due to pattern density on the photomask.

Accordingly, it is an object of the present invention to provide an improved aaPSM that allows for end point detection using an OES technique.

It is a further object of the present invention to provide an improved aaPSM that also allows for additional overetch time to adjust for any non-uniformities associated with plasma loading effects due to pattern density on the photomask.

It is another object of the present invention to solve the shortcomings of the prior art.

Other objects will become apparent from the foregoing description.

SUMMARY OF THE INVENTION

It has now been found that the above and related objects of the present invention are obtained in the form of an aaPSM having an internal substantially transparent etch stop layer and at least one deposited layer formed thereon. The deposited layer may be either a deposited substantially transparent layer, such as $SiO_2$, a deposited partially transparent layer, such as MoSi, or a deposited opaque layer, such as Cr. The internal substantially transparent etch stop layer of the present invention remains on the blank although the additional layers will be removed to form a patterned photomask. The characteristics of the internal substantially transparent etch stop layer of the present invention may include: (1) imperviousness to dry etch attack; (2) imperviousness to wet etch attack; (3) offering high transmission at desired wavelengths; (4) imperviousness to degradation under exposed radiation conditions; (5) offering an improvement for defect repair integration; (6) capability of being deposited in sufficient thickness as to allow for intensity balancing without undercut for alternating aperture phase shifting applications; (7) imperviousness to absorption of significant radiation at the exposure wavelengths such as 157 nm, 193 nm, and/or 248 nm; (8) capability of being deposited with either evaporative or sputtered techniques; (9) film properties of excellent adhesion and proper stress balancing; (10) allowing for end point detection during plasma dry etch processing to remove the top layer(s). In a preferred embodiment, the internal substantially transparent etch stop layer of the present invention is comprised of $MgF_x$ and even more particularly is comprised of $MgF_2$ deposited under evaporation. Other materials that may be used for the substantially transparent etch stop layer of the present invention include, but are not limited to, $Al_2O_3$ and $Al_xN_y$.

More particularly, the present invention relates to a blank photomask comprising: a photosensitive resist material layer; an opaque layer underlying the photosensitive resist material layer; a deposited substantially transparent layer underlying the opaque layer, a substantially transparent etch stop layer underlying the deposited substantially transparent layer, and a substantially transparent substrate underlying the substantially transparent etch stop layer. The deposited substantially transparent layer is of a thickness equal to λ/2(n−1), so that when the blank photomask is processed into an aaPSM, patterned regions are formed to comprise at least one opening exposing the deposited substantially transparent layer, and at least one light transmitting opening in which the deposited substantially transparent layer has been removed.

The present invention is also directed to a method for creating an aaPSM from the blank photomask described above and comprises the step of providing a blank photomask comprising a photosensitive resist material layer; an opaque layer underlying the photosensitive resist material layer; a deposited substantially transparent layer underlying the opaque layer, a substantially transparent etch stop layer underlying the deposited substantially transparent layer, and a substantially transparent substrate underlying the substantially transparent etch stop layer. The method further comprises the steps of forming in the blank photomask at least one opening exposing the deposited substantially transparent layer, and at least one light transmitting opening in which the deposited substantially transparent layer has been removed.

Additionally, the present invention is directed to an aaPSM comprising: a patterned opaque layer with a first set of at least one light transmitting openings and a second set of at least one light transmitting openings; a deposited substantially transparent layer underlying the opaque layer wherein the deposited substantially transparent layer has corresponding light transmitting openings to each of the openings of the first set of at least one light transmitting openings, a substantially transparent etch stop layer underlying the deposited substantially transparent layer, and a substantially transparent substrate underlying the substantially transparent etch stop layer.

Additionally, the present invention is directed to a method for manufacturing a semiconductor comprising the steps of: interposing an aaPSM between a semiconductor wafer and an energy source, wherein the aaPSM comprises an patterned opaque layer with a first set of at least one light transmitting openings and a second set of at least one light transmitting openings; a deposited substantially transparent layer underlying the opaque layer wherein the deposited substantially transparent layer has corresponding light transmitting openings to each of the openings of the first set of at least one light transmitting openings, a substantially transparent etch stop layer underlying the deposited substantially transparent layer, and a substantially transparent substrate underlying the substantially transparent etch stop layer. The method further comprises the steps of generating energy in the energy source; transmitting the generated energy through the first and second set of at least one light transmitting openings; and etching an image on the semiconductor wafer corresponding to a pattern formed by the first and second set of at least one light transmitting openings.

BRIEF DESCRIPTION OF THE DRAWINGS

The above and related objects, features and advantages of the present invention will be more fully understood by reference to the following, detailed description of the preferred, albeit illustrative, embodiment of the present invention when taken in conjunction with the accompanying figures, wherein.

DETAILED DESCRIPTION OF THE PREFERRED EMBODIMENTS

The present invention is directed to an improved aaPSM and method for making the same. More particularly, the present invention utilizes a substantially transparent etch stop layer between a substantially transparent substrate and a deposited substantially transparent layer to insure that a proper opening depth is obtained in the formation of an aaPSM and other photomasks which require etching of substantially transparent substrates. Evan more particularly, the internal substantially transparent etch stop layer of the present invention can have additional layers deposited thereon. The internal substantially transparent etch stop layer of the present invention remains on the blank although the additional layers will be removed to form a patterned photomask. The characteristics of the internal substantially transparent etch stop layer of the present invention may include: (1) imperviousness to dry etch attack; (2) imperviousness to wet etch attack; (3) offering high transmission at desired wavelengths; (4) imperviousness to degradation under exposed radiation conditions; (5) offering an improvement for defect repair integration; (6) capability of being deposited in sufficient thickness as to allow for intensity balancing without undercut for alternating aperture phase shifting applications; (7) imperviousness to absorption of significant radiation at the exposure wavelengths of 157 nm, 193 nm, and or 248 nm; (8) capability of being deposited with either evaporative or sputtered techniques; (9) film properties of excellent adhesion and proper stress balancing; (10) allowing for end point detection during plasma dry etch processing to remove the top layer(s). In a preferred embodiment, the internal substantially transparent etch stop layer of the present invention is comprised of $MgF_2$ deposited under evaporation. Alternatively, other suitable materials such as $Al_2O_3$ or $Al_xN_y$ may also be used as the substantially transparent etch stop layer.

Figure 3:
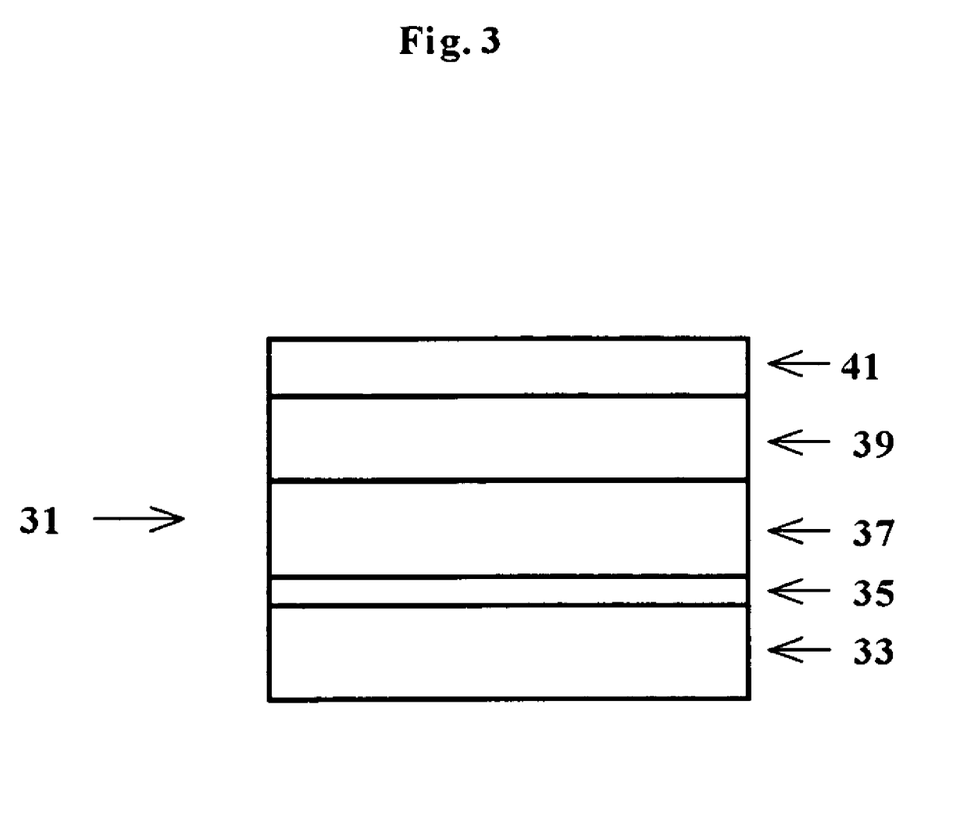
FIG. 3 shows a cross-sectional view of a photomask blank made in accordance with the present invention.

More particularly, referring to FIG. 3, a blank photomask 31 made in accordance with the present invention is shown. The blank photomask 31 preferably includes five layers, but may include additional layers as needed or desired by the photomask manufacturer. In particular, the blank photomask 31 includes a substantially transparent layer 33, such as quartz, glass or fused silica. The next layer is a substantially transparent etch stop layer 35. In one embodiment the substantially transparent etch stop layer 35 is comprised of magnesium fluoride ($MgF_x$). In a preferred embodiment the substantially transparent etch stop layer is comprised of e-beam evaporation of optical quality $MgF_2$ coatings at $\lambda/4$ thickness at 193 nm. The next layer is a deposited substantially transparent layer 37 having a thickness of $\lambda/2(n-1)$. The deposited substantially transparent layer 37 is preferably comprised of $SiO_2$, but may be comprised of other materials that are substantially transparent at the exposure wavelengths. The next layer is a opaque layer 39 (e.g., chrome) capable of absorbing all (or most) light to which it is exposed. The opaque layer 38 may additionally include an anti-reflective layer, such as chrome oxide, if desired or needed. The next layer is a photosensitive material 41.

To form the aaPSM of the present invention, a pattern defined by an electronic file is transferred to the blank photomask using conventional lithography tools, including, for example, E-beam and/or laser beam writing tools. In one embodiment, the laser source which is used operates at 365 nm, however, the present invention is not limited to this particular wavelength laser source and will work with a variety of different image sources as discussed herein. As described in detail below, the blank photomask 31 is etched to form an aaPSM 51 having types of transmissive regions: (1) an unetched, film recess 40 covering a corresponding unetched portion of the deposited substantially transparent layer 37; and (2) a subtractively etched trench 42 etched in the deposited substantially transparent layer 37 up to the substantially transparent etch stop layer 35. In a preferred embodiment, these transmissive regions alternate between opaque regions on the photomask, as shown in FIG. 4.

Figure 4:
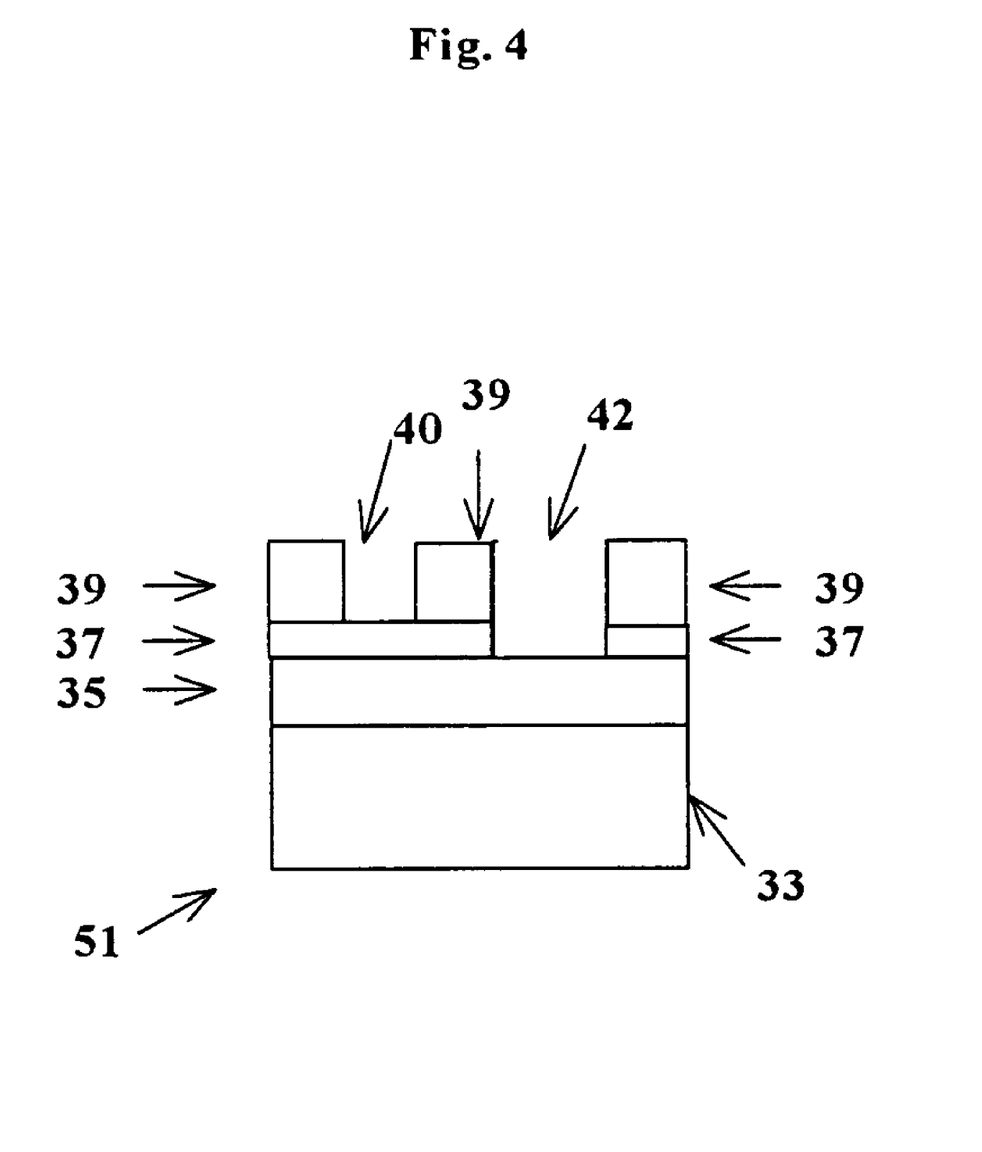
FIG. 4 shows a finished aaPSM made in accordance with the present invention using the photomask blank of FIG. 3.
Figure 5:
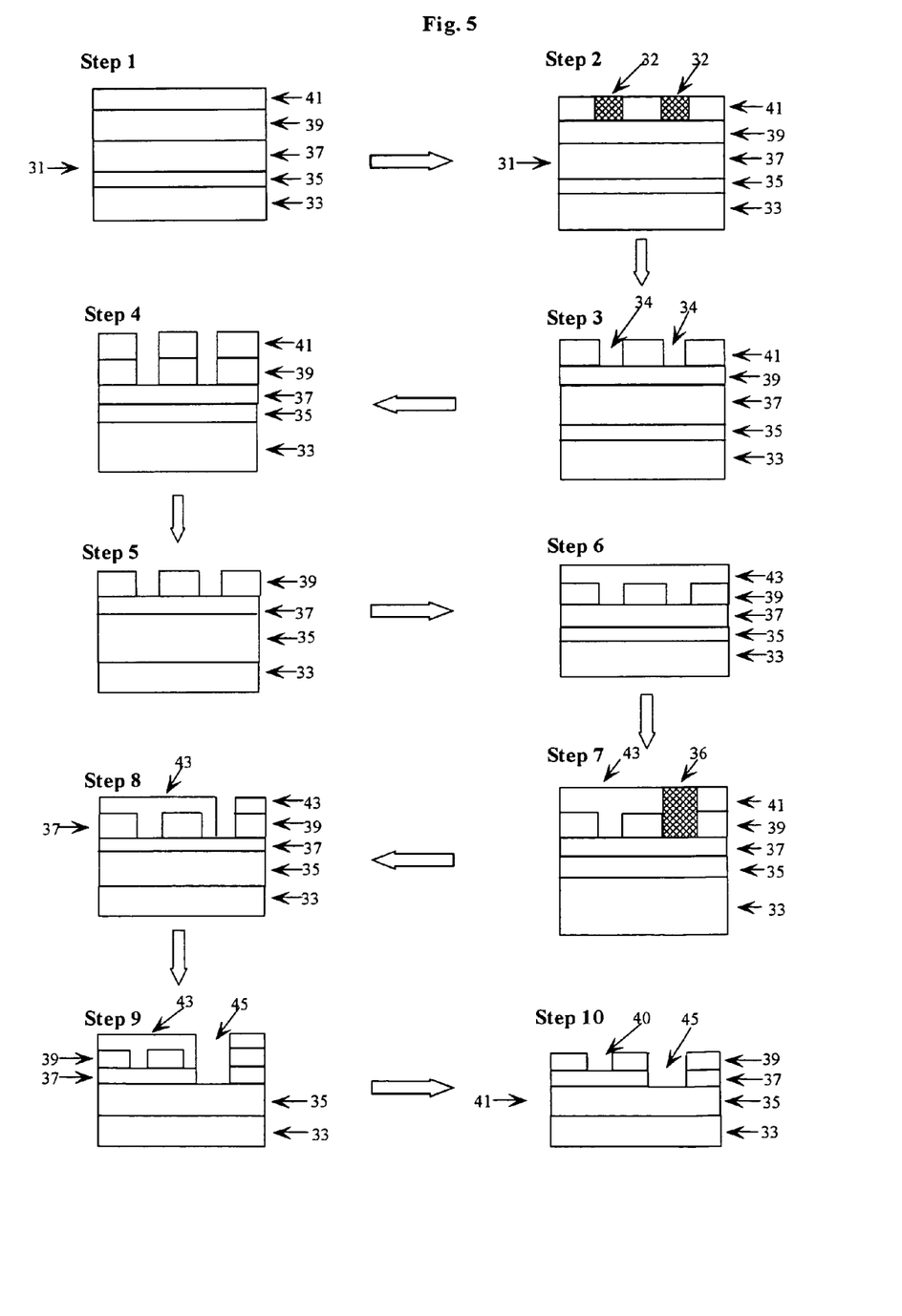
FIG. 5 shows the processing steps used to manufacture an aaPSM in accordance with the present invention.

In one embodiment of the present invention to make the aaPSM of FIG. 4, a pattern in the opaque regions of the photomask is defined by the following steps. Referring to FIG. 5, the blank photomask of FIG. 3 is provided, Step 1. Predefined areas 32 in the photosensitive resist layer 41 of the blank photomask 31 are exposed to an energy source (e.g., a light source), Step 2. Thereafter, the exposed photoresist 32 is developed (e.g., removed), thereby forming a recess 34 in the photosensitive resist layer 31, Step 3. Next, the portions of the opaque layer 39 underlying the recesses 34 are removed by conventional etching techniques (e.g., dry etching or chemical etching), Step 4. Thereafter, the remaining photosensitive resist 41 overlying the undeveloped portions of the opaque layer 39 is removed, thereby exposing portions of the deposited substantially transparent layer 37 underlying the removed portions of the opaque layer 39, Step 5. As a result, the un-etched portions of the opaque layer 33 serve to block the exposure light during wafer printing, whereas the portions of the opaque layer which have been etched away define the region of the deposited substantially transparent layer 37 and substantially transparent layer 33 which allows exposure light from the Stepper to pass through. In essence, the first processing stage of the method of the present invention is used to form a modified version of a conventional binary photomask by patterning an opaque layer.

Next, alternating phase-shift features are formed in the deposited substantially transparent layer 37. This is also accomplished in several steps in this embodiment of the present invention. In particular, after Step 5 has been completed, the remaining portions of the opaque layer 39 and the uncovered portions of the deposited substantially transparent layer are re-coated with photosensitive resist 43, Step 6. Predefined areas 36 in the photosensitive resist layer 43 of the partially processed photomask are exposed to an energy source, Step 7. In this regard, these predefined areas preferably alternate with the recesses 40 wherein a portion of chrome separates each alternating recess 40 (see Step 10 below) and predefined area. However, the present invention is not limited to PSMs which have alternating etched regions. It may also be used in any PSM which has etched regions of different depths, whether alternating or not. Next, the exposed areas 36 of the photosensitive resist layer 39 are developed (e.g., removed), Step 8. Thereafter, the portions of the deposited substantially transparent layer 39 that are no longer covered by photosensitive resist material 43 (or opaque material 39) are etched to the substantially transparent etch stop layer 35, Step 9. The thickness of the deposited substantially transparent layer is chosen to satisfy equation (1). As a result, a phase shifted, transmissive vertical trench 45 is formed in the deposited substantially transparent layer 37. Thereafter, the remaining photoresist 43 is removed, Step 10. The result is an aaPSM having a vertical trench 45 alternating with unetched recess 40 in the deposited substantially transparent layer.

It is noted, however, that the method for processing the aaPSM of the present invention is not limited to the particular processing steps. In this regard, the processing method could be modified so long as the same results are achieved. Additionally, it is noted that the aaPSM of the present invention can be modified to be etched to different depths, in which case more than one substantially transparent etch stop layer and a corresponding number of deposited substantially transparent layers can be used.

In one embodiment of the present invention, the specified depth and the thickness of substantially transparent layer 33 can be selected so that the light that passes through the unetched recess 40 is approximately 180° out of phase from light that passes through the vertical trench 45, in accordance with the teachings of co-pending U.S. patent application Ser. No. 10/391,001, filed Mar. 18, 2003 to the same assignee, which is hereby incorporated by reference herein. By making and using an aaPSM in this manner, there is zero asymmetry between the critical dimensions of the trench 45 and the unetched recess 40 of the deposited substantially transparent layer 37. As a result, the light intensity transmitted through these regions is balanced. Thus, it is possible to write an accurate image on a semiconductor wafer in a more efficient manner than was possible by prior art methods. In this regard, since the method of the present invention requires fewer etching steps (e.g., it does not require the step of undercutting the opaque layer), the overall output of aaPSMs over a given time period increases.

Alternatively, known and unknown techniques of balancing aerial intensities in aaPSMs can be used with the present invention, such as those disclosed in U.S. Publication No. 2001/0044056A1 and U.S. patent application Ser. No. 10/288,736, filed Nov. 5, 2002, to the same assignee, without departing from the spirit of the present invention.

In selecting the material and thickness of the substantially transparent etch stop layer and the deposited substantially transparent layer of the present invention, the following factors should be considered:

(1) Impervious to dry etch attack. The deposited material should have very low and perhaps no noticeable removal in dry plasma etch chemistry containing chlorine and/or fluorine species. Hence, it should as a barrier in the removal of the top layers of the photomask during pattern definition. Experiments have demonstrated that the use of a substantially transparent etch stop layer comprised of $MgF_2$ deposited under evaporation are impervious to fluorine species using a decoupled plasma source system such as manufactured by Applied Materials, Inc. The substantially transparent etch stop layers should not be removed in sufficient quantity in Inductively Couple Plasma Source, Reactive Ion Etch Sources and similar sources that those skilled in the art may want to apply.

(2) Impervious to wet etch attack. The deposited material should have very low and perhaps no noticeable removal in wet chemistry containing $NH_4OH$ and acid based solutions, such as $H_2SO_4$ or HCL or other similar chemistries that those skilled in the art should apply.

Figure 6:
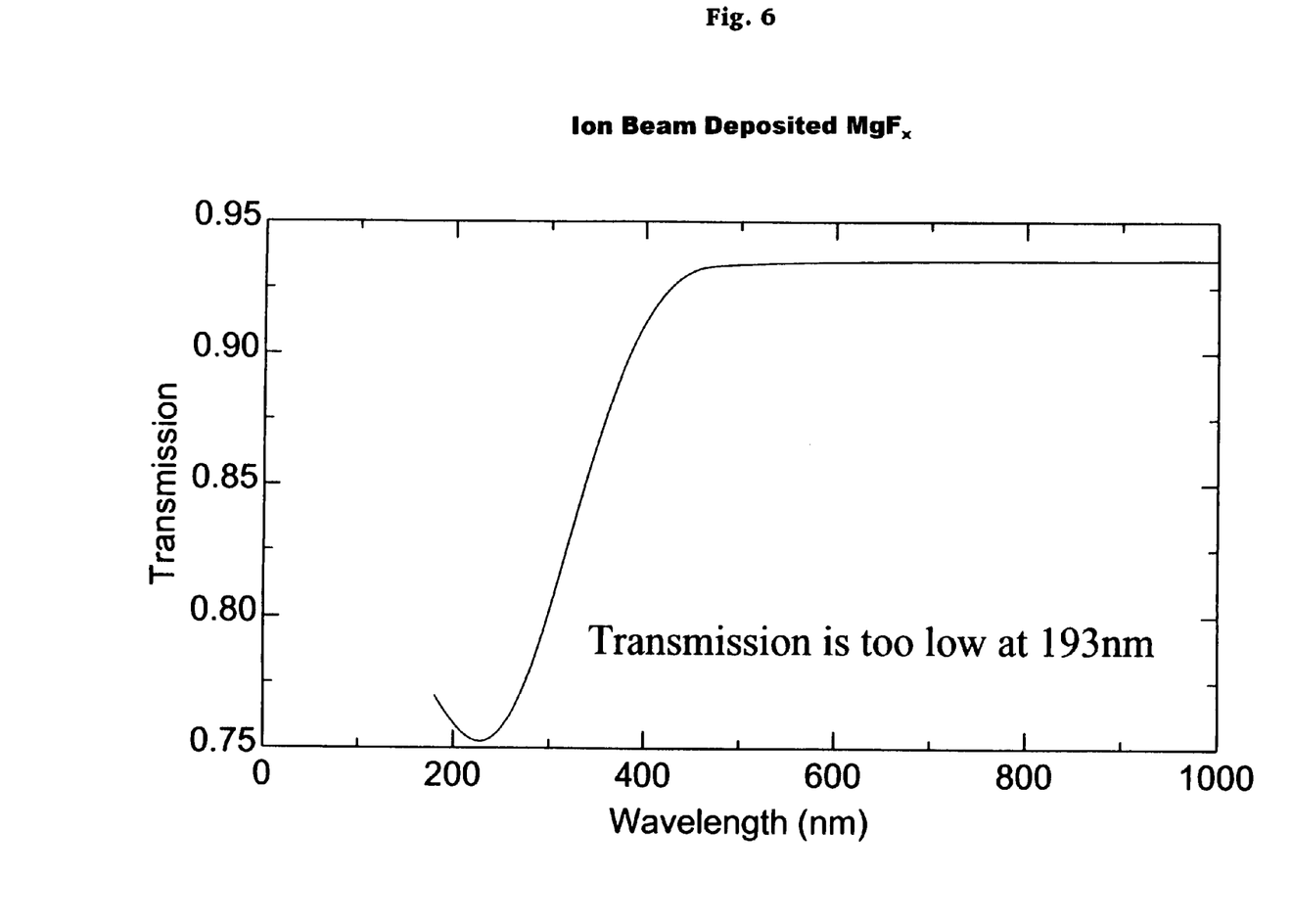
FIG. 6 is a graph showing the effectiveness of $MgF_x$ as a substantially transparent etch stop layer in accordance with the present invention.

(3) Offers High Transmission at the desired wavelength (e.g., 157 nm, 193 nm, and 248 nm). The etch stop layer should be made of a material which when deposited should improve the transmission of the photomask above the standard measured transmission by minimizing reflections off the photomask that would be lost from the system. For example, as FIG. 6 shows, when $MgF_2$ was used as an etch stop layer, the transmission improved by about 3 to 5 percent at the exposure wavelength.

(4) Consistent Optical Properties At Actinic Exposures. The optical properties of the material should not significantly change under actinic exposures (e.g., 157 nm, 193 nm, and 248 nm). Hence, the transmission remains the same for the lifetime of the photomask during normal use, the optical properties do not change during normal use, the film does not change in any undesired way during normal usage.

(5) Defect Repair Improvement. The use of a substantially transparent etch stop layer allows for additional opportunities to repair defects detected in an unwanted area. One technique is to utilize a focused ion beam (FIB) with $XeF_2$ chemistry to remove the defect over substantially transparent etch stop layer. The substantially transparent etch stop layer acts as protection layer for the underlying substrate so that a phase and or transmission error should not occur during the repair technique. One skilled in the art should be able to repair the substrate using an electron beam or laser beam in similar conditions. Without the substantially transparent etch stop layer, repair work of the defect by further etching would be more difficult since it is likely that there would be a significant change to the optical properties of the photomask rendering it sufficiently deficient or perhaps totally useless for the given application.

(6) Intensity balancing. By selecting an etch stop layer of the appropriate material and thickness in accordance with the teaching of co-pending U.S. patent application Ser. No. 10/391,001, filed on Mar. 18, 2003, to the same assignee, discussed above, the etch stop layer should be able to provide compensation for the intensity balance one would see in an alternating phase shift application. In such an embodiment, the etch stop layer can act as an attenuator if deposited in the correct thickness in the areas where a trench does not exist. Hence, this eliminates the need for an undercut process which enable very advanced applications such as at the 65 nm node and below that would normally have problems in designing around the undercut requirement and minimum feature width. It allows for smaller geometries on the photomask and hence, smaller geometries on the wafer.

(7) High Transmission. The material of the etch stop layer of the present invention should have a low extinction coefficient (k) at or near zero. Therefore, the transmission through the material is at close to 100% of the exposed wavelength.

(8) Easily Deposited. The material of the etch stop layer of the present invention should be able to be deposited with known deposition techniques such as sputter deposition, evaporative deposition, chemical vapor deposition, metal organic epitaxy, etc.

(9) Proper Stress and Adhesion Characteristics. The material of the etch stop layer of the present invention should be made to exhibit the proper stress and adhesion to be used in this application.

(10) Proper End Point Detection. Most significantly, the etch stop layer allows for end point detection for dry plasma etch applications, or other etching procedures.

Figure 7:
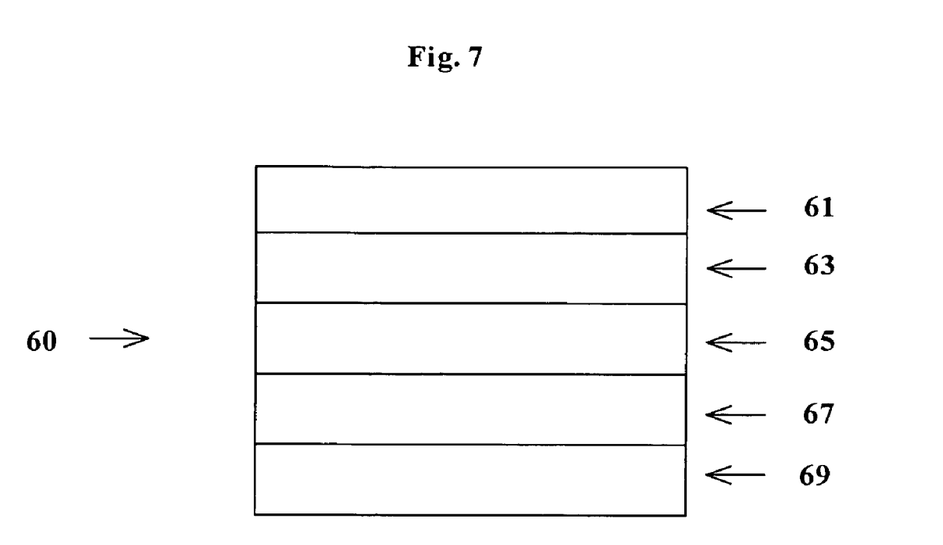
FIG. 7 shows a blank phase shift mask having a deposited partially transparent layer and a substantially transparent etch stop layer in accordance with the present invention.

In another embodiment, as shown in FIG. 7, the substantially transparent etch stop layer may be used in a blank phase shift photomask 60 (e.g., embedded attenuated phase shift photomask ("EAPSM")) comprising: a photosensitive resist material layer 61; an opaque layer 63 underlying said photosensitive resist material layer 61; a deposited partially transparent layer 65 underlying the opaque layer 63; a substantially transparent etch stop layer 67 underlying the deposited partially transparent layer 65; and a substantially transparent substrate 69 underlying the substantially transparent etch stop layer 65. In a preferred form of this embodiment, the substantially transparent etch stop layer may be comprised of $MgF_x$. Alternatively, the substantially transparent etch stop layer may be comprised of $Al_2O_3$ or $Al_xO_y$, or other similar materials based on the selection criteria discussed above. In an embodiment where an exposure wavelength of 157 nm is to be used with the EAPSM, the deposited partially transparent layer 65 may be comprised of SiON and the substantially transparent layer (e.g., quartz or fused silica) may be doped with fluorine to facilitate a high transmission of light (e.g., about 85%). In these embodiments of the present invention, the blank phase shift photomask can be processed as discussed above such that during processing, the etch stop layer will act as an etch stop of the deposited partially transparent layer.

Figure 8:
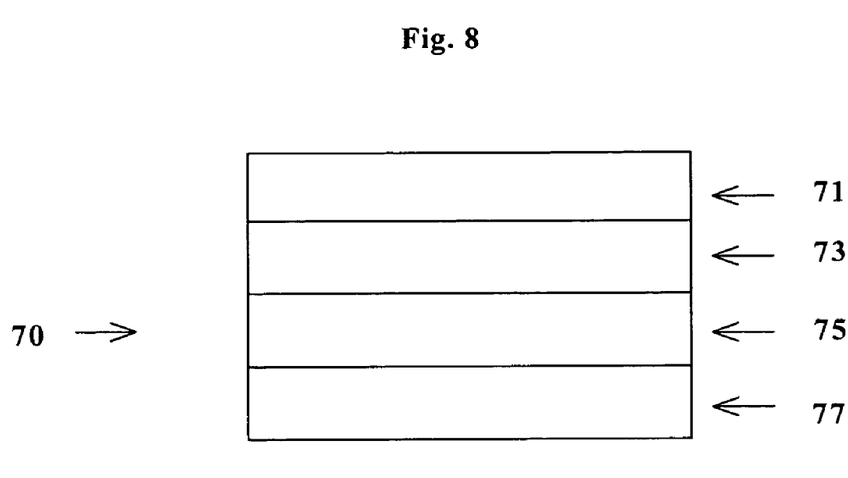
FIG. 8 shows a blank photomask having a deposited opaque layer and a substantially transparent etch stop layer in accordance with the present invention.

In another embodiment as shown in FIG. 8, the substantially transparent etch stop layer may be used in a blank photomask 70 comprising: a photosensitive resist material layer 71; an opaque layer 73 underlying said photosensitive resist material layer 71; a substantially transparent etch stop layer 75 underlying the opaque layer 73; and a substantially transparent substrate 77 underlying the substantially transparent etch stop layer. In a preferred form of this embodiment, the substantially transparent etch stop layer 75 may be comprised of $MgF_x$, the opaque layer 73 is comprised of chrome and the substantially transparent layer 75 is comprised of fused silica. This combination of materials will not impart a phase error or transmission error, thus preventing over etching into the fused silica substrate. Alternatively, the substantially transparent etch stop layer 75 may be comprised of $Al_2O_3$ or $Al_xO_y$, or other similar materials based on the selection criteria discussed above. In yet another embodiment, the opaque layer may be comprised of tantalum compounds (e.g., Ta, TaN, etc.). These materials etch in fluorine, and thus, when used with an internal substantially transparent etch stop layer (e.g., $MgF_x$), over etching into the substantially transparent substrate (e.g., fused silica) is prevented. In an embodiment where an exposure wavelength of 157 nm is to be used with the photomask, the substantially transparent layer (e.g., quartz or fused silica) may be doped with fluorine. In these embodiments of the present invention, the blank photomask can be processed as discussed above or in any other appropriate manner such that during processing, the etch stop layer will act as an etch stop of the opaque layer.

Now that the preferred embodiments of the present invention have been shown and described in detail, various modifications and improvements thereon will become readily apparent to those skilled in the art. For example, the etch stop layer of the present invention may be used in a wide variety of photomasks. Further, the present invention is not limited to the precise processing steps described herein. In this regard, the aaPSM or other photomasks of the present invention may be made with fewer or more processing steps, depending upon the equipment used and needs of the photomask maker. Further, the method of the present invention may also, for example, form all the unetched regions 40 in a series of processing steps, and form the etched regions 45 in a second series of processing steps. Thus, the present embodiments are therefor to be considered in all respects as illustrative and not restrictive, the scope of the invention being indicated by the appended claims, and all changes that come within the meaning and range of equivalency of the claims are therefore intended to be embraced therein.

What is claimed is:

1. A blank alternating aperture phase shift photomask comprising:
    (a) a photosensitive resist material layer;
    (b) an opaque layer underlying said photosensitive resist material layer;
    (c) a deposited substantially transparent layer underlying the opaque layer;
    (d) a substantially transparent etch stop layer underlying the deposited substantially transparent layer, the substantially transparent etch stop layer being comprised of Mg and F; and
    (e) a substantially transparent substrate underlying the substantially transparent etch stop layer, wherein said deposited substantially transparent layer is of a thickness equal to $\lambda/2(n-1)$, where $\lambda$ is a wavelength of an exposure tool intended to be used with said photomask after processing.

2. The blank alternating aperture phase shift photomask of claim 1, wherein said substantially transparent etch stop layer is comprised of $MgF_x$, where x is approximately 2.

3. The blank alternating aperture phase shift photomask of claim 1, wherein said substantially transparent substrate comprises either quartz, glass and/or fused silica and said opaque layer comprises chromium.

4. The blank alternating aperture phase shift photomask of claim 1, wherein said deposited substantially transparent layer comprises Si and O.

5. The blank alternating aperture phase shift photomask of claim 1, wherein said opaque layer comprises an antireflective layer.

6. The blank alternating aperture phase shift photomask of claim 5, wherein said antireflective layer comprises chrome.

7. A method for creating an alternating aperture phase shift photomask from a blank photomask comprising the steps of:
(a) providing said blank photomask comprising a photosensitive resist material layer; an opaque layer underlying the photosensitive resist material layer; a deposited substantially transparent layer underlying the opaque layer, a substantially transparent etch stop layer underlying the deposited substantially transparent layer, the substantially transparent etch stop layer being comprised of Mg and F, and a substantially transparent substrate underlying the substantially transparent etch stop layer;
(b) forming in said blank photomask a first set of at least one light transmitting opening exposing said deposited substantially transparent layer; and
(c) forming in said blank photomask a second set of at least one light transmitting opening in which a portion of said deposited substantially transparent layer has been removed and a portion said substantially transparent etch stop layer has been exposed.

8. The method of claim 7, wherein said substantially transparent etch stop layer is comprised of $MgF_X$, where X is approximately 2.

9. The method of claim 7, wherein said substantially transparent substrate comprises either quartz, glass and/or fused silica and said opaque layer comprises chromium.

10. The method of claim 7 further comprising the steps of:
(d) repairing a defect over said substantially transparent etch stop layer by using a focused ion beam with $XeF_2$ chemistry.

11. The method of claim 7, wherein said deposited substantially transparent layer comprises Si and O.

12. The method of claim 7, wherein said opaque layer comprises an antireflective layer.

13. The method of claim 12, wherein said antireflective layer comprises chrome.

14. An alternating aperture phase shift photomask comprising:
(a) a patterned opaque layer with a first set of at least one light transmitting openings and a second set of at least one light transmitting openings;
(b) a deposited substantially transparent layer underlying the opaque layer wherein the deposited substantially transparent layer has corresponding light transmitting openings to each of the openings of the first set of at least one light transmitting openings,
(c) a substantially transparent etch stop layer underlying the deposited substantially transparent layer, the substantially transparent etch stop layer being comprised of Mg and F, and
(d) a substantially transparent substrate underlying the substantially transparent etch stop layer.

15. The alternating aperture phase shift photomask of claim 14, wherein said substantially transparent etch stop layer is comprised of $MgF_X$, where X is approximately 2.

16. The alternating aperture phase shift photomask of claim 14, wherein said substantially transparent substrate comprises either quartz, glass and/or fused silica and said opaque layer comprises chromium.

17. The alternating aperture phase shift photomask of claim 14, wherein said deposited substantially transparent layer comprises Si and O.

18. The alternating aperture phase shift photomask of claim 14, wherein said opaque layer comprises an antireflective layer.

19. The alternating aperture phase shift photomask of claim 18, wherein said antireflective layer comprises chrome.

20. A method for manufacturing a semiconductor comprising the steps of:
interposing an alternating aperture phase shift photomask between a semiconductor wafer and an energy source, wherein said alternating aperture phase shift photomask comprises:
an patterned opaque layer with a first set of at least one light transmitting openings and a second set of at least one light transmitting openings;
a deposited substantially transparent layer underlying the opaque layer wherein the deposited substantially transparent layer has a set of corresponding light transmitting openings to each of the openings of the first set of at least one light transmitting openings;
a substantially transparent etch stop layer underlying the deposited substantially transparent layer, the substantially transparent etch stop layer being comprised of Mg and F; and
a substantially transparent substrate underlying the substantially transparent etch stop layer;
generating energy in the energy source;
transmitting the generated energy through said first and second sets of at least one light transmitting openings and said set of corresponding light openings;
and etching an image on the semiconductor wafer corresponding to a pattern formed by said first and second set of at least one light transmitting openings and said corresponding set of light transmitting openings.

21. The method of claim 20, wherein said substantially transparent etch stop layer is comprised of $MgF_X$, where X is approximately 2.

22. The method of claim 20, wherein said substantially transparent substrate comprises either quartz, glass and/or fused silica and said opaque layer comprises chromium.

23. The method of claim 20, wherein said deposited substantially transparent layer comprises Si and O.

24. The method of claim 20, wherein said opaque layer comprises an antireflective layer.

25. The method of claim 24, wherein said antireflective layer comprises chrome.

26. A blank phase shift photomask comprising:
(a) a photosensitive resist material layer;
(b) an opaque layer underlying said photosensitive resist material layer;
(c) a deposited partially transparent layer underlying the opaque layer;
(d) a substantially transparent etch stop layer underlying the deposited partially transparent layer, the substantially transparent etch stop layer being comprised of Mg and F; and
(e) a substantially transparent substrate underlying the substantially transparent etch stop layer.

27. The blank phase shift photomask of claim 26, wherein said substantially transparent etch stop layer is comprised of $MgF_X$, where X is approximately 2.

28. The blank phase shift photomask of claim 26, wherein said opaque layer comprises an antireflective layer.

29. The blank phase shift photomask of claim 28, wherein said antireflective layer comprises chrome.

30. The blank phase shift photomask of claim 26, wherein said deposited substantially transparent layer comprises Si and O.

31. A blank photomask comprising:
(a) a photosensitive resist material layer;
(b) an opaque layer underlying said photosensitive resist material layer;
(c) a substantially transparent etch stop layer underlying the opaque layer, the substantially transparent etch stop layer being comprised of Mg and F; and
(e) a substantially transparent substrate underlying the substantially transparent etch stop layer.

32. The blank photomask of claim 31, wherein said substantially transparent etch stop layer is comprised of $MgF_X$, where X is approximately 2.

33. The blank photomask of claim 31, wherein said deposited substantially transparent layer comprises Si and O.

34. The blank photomask of claim 31, wherein said opaque layer comprises an antireflective layer.

35. The blank photomask of claim 34, wherein said antireflective layer comprises chrome.

* * * * *